United States Patent [19]
Person

[11] Patent Number: 5,639,391
[45] Date of Patent: Jun. 17, 1997

[54] LASER FORMED ELECTRICAL COMPONENT AND METHOD FOR MAKING THE SAME

[75] Inventor: Herman R. Person, Columbus, Nebr.

[73] Assignee: Dale Electronics, Inc., Columbus, Nebr.

[21] Appl. No.: 539,506

[22] Filed: Oct. 6, 1995

Related U.S. Application Data

[63] Continuation of Ser. No. 73,125, Jun. 7, 1993, which is a continuation-in-part of Ser. No. 823,126, Jan. 21, 1992, abandoned, which is a continuation-in-part of Ser. No. 587,761, Sep. 24, 1990, Pat. No. 5,091,286.

[51] Int. Cl.$^6$ .................. B23K 26/06; H01F 27/28
[52] U.S. Cl. .................. 219/121.68; 219/121.6; 219/121.73; 219/121.75; 336/180
[58] Field of Search .................. 219/121.6, 121.68, 219/121.69, 121.73, 121.75; 336/180

[56] References Cited

U.S. PATENT DOCUMENTS

| | | | |
|---|---|---|---|
| 2,832,935 | 4/1958 | Tank | 333/29 |
| 3,089,106 | 5/1963 | Saaty | 336/200 |
| 3,125,746 | 3/1964 | Broadbent | 340/174 |
| 3,210,707 | 10/1965 | Constantakes | 336/200 |
| 3,247,573 | 4/1966 | Noack | 29/155.5 |
| 3,413,716 | 12/1968 | Schwertz et al. | 29/602 |
| 3,490,055 | 1/1970 | Cox | 333/70 |
| 3,798,059 | 3/1974 | Astle et al. | 117/212 |
| 4,128,752 | 12/1978 | Gravel | 219/121 L |
| 4,183,074 | 1/1980 | Wallace | 361/402 |
| 4,313,151 | 1/1982 | Vranken | 361/402 |
| 4,313,152 | 1/1982 | Vranken | 361/402 |
| 4,322,698 | 3/1982 | Takahashi et al. | 333/184 |
| 4,342,143 | 8/1982 | Jennings | 29/25.42 |
| 4,613,843 | 9/1986 | Esper et al. | 336/232 |
| 4,877,480 | 10/1989 | Das | 430/945 |
| 4,909,895 | 3/1990 | Cusano | 156/643 |
| 4,915,981 | 4/1990 | Traskos et al. | 427/53.1 |
| 4,959,631 | 9/1990 | Hasegawa | 336/83 |
| 5,269,673 | 12/1993 | Smith | 219/121.68 |

OTHER PUBLICATIONS

Lambda Physik, Inc., "Lambda Mark, An Excimer Laser Non-contact Marker", Aug., 1988.

Palomar Systems & Machines, Inc., "Model 5000 Laser Marker System Product Manual", Mar. 20, 1990.

*Primary Examiner*—Teresa J. Walberg
*Assistant Examiner*—J. Pelham
*Attorney, Agent, or Firm*—Zarley, McKee, Thomte, Voorhees, & Sease

[57] ABSTRACT

An electrical component includes a plurality of laminated layers 34, 44, 53, 64, of ferrite material, each layer having a conductive coil 40, 50, 58, 70 printed thereon. The conductive coil is formed by first printing a conductive sheet material 36, 48, 56, 68 on top of the ferrite layer, and then by exposing the conductive sheet material to a burst of laser energy focused in a predetermined pattern which cuts the coil out of the conductive sheet member.

13 Claims, 2 Drawing Sheets

LASER FORMED ELECTRICAL COMPONENT AND METHOD FOR MAKING THE SAME

This is a continuation of application Ser. No. 08/073,125 filed on Jun. 7, 1993, now abandoned, which is a Continuation-In-Part of application Ser. No. 823,126 now abandoned, filed Jan. 21, 1992, which is a continuation in-part of application Ser. No. 07/587,761, filed Sep. 24, 1990, now U.S. Pat. No. 5,091,286.

BACKGROUND OF THE INVENTION

The present invention relates to a laser-formed electrical component and method for making same. Specifically, the present invention relates to a laminated electrical component comprising laminated layers of insulating material alternated with printed patterns of helical coils formed from electrical conductive material.

Many electrical components utilizing coils have been manufactured in chip form, with various alternating layers of ferrite material and conductors. However, there are several disadvantages resulting from the present methods of manufacturing these devices. Most coils formed in this manner do not include a complete coil having more than one revolution at each laminated layer. Instead, present devices place a portion of each coil on different layers and connect these portions to provide a completed coil having several turns.

Some present devices to place an entire coil having more than one turn on each ferrite layer; however, such devices are limited in their ability to be miniaturized due to the limitations of the printing techniques used. Present methods for forming the conductive coils on each layer usually involve the printing of the conductive material on the ferrite layer. Most techniques for printing these layers do not permit the lines to be much smaller than 8–10 mills., and do not permit the spaces between the lines to be much smaller than 8–10 mills. This minimum dimension of the lines and spaces places a limit on the amount of miniaturization which can be achieved with coils of this type.

Lasers have been utilized in the resistor art for trimming resistors, and for forming resistors. However, the laser methods presently being used involve the tracing with a laser beam along the particular pattern of conductor desired. This is a time consuming task and does not permit the conductor to be formed in a quick instantaneous fashion.

Therefore, a primary object of the present invention is the provision of an improved laser-formed electrical component and method for making same.

A further object of the present invention is the provision of an improved laser-formed electrical component which can be manufactured to smaller sizes than prior art devices, while at the same time achieving the same or greater inductance value than presently available.

A further object of the present invention is the provision of a method and means for making electrical components which permits the width of the inductance coil lines and the width of the spaces between the inductor coil lines to be made smaller than in prior devices.

A further object of the present invention is the provision of a device and method which is economical to use, efficient in operations, and reliable.

SUMMARY OF THE INVENTION

The present invention utilizes a laser system which is capable of directing a burst of laser energy through a mask assembly. The mask may be a metal plate into which the desired pattern has been cut. Acting like a stencil, the mask causes the image of the desired pattern to be focused through a lens onto a substrate having a layer of conductive material thereon. The image burns away a portion of the conductor layer, leaving the desired pattern such as a coil or other electrical conductor path.

Inductor coils can be manufactured to include alternating layers of ferrite material and conductor coils. The conductor coils are formed by printing a layer of conductive material such as silver on the upper surface of a ferrite layer. The laser is then used to project a negative image on the conductor layer so as to remove the conductive material exposed to the negative image. This leaves the conductive coil formed on the upper surface of the ferrite layer.

Additional pairs of layers may be formed in the same fashion and stacked upon one another to create a stacked chip having a complete conductive coil having more than one complete turn at each layer. Holes are provided in the ferrite layers for connecting the various conductive coils within the laminated chip in series with one another to achieve the desired inductance.

Laser systems are presently available which are capable of projecting an image over an area from 5 to 10 square millimeters. This permits several chips to be formulated at once. Thus, it is possible to manufacture a single layer for a group of chips with one single burst of the laser energy. The individual layers are manufactured separately, and then are stacked upon one another and fired so as to form them into a single laminated group of layers. Diamond saws are then used to cut the stacked layers into individual chips.

DESCRIPTION OF THE PREFERRED EMBODIMENT

Figure 1:
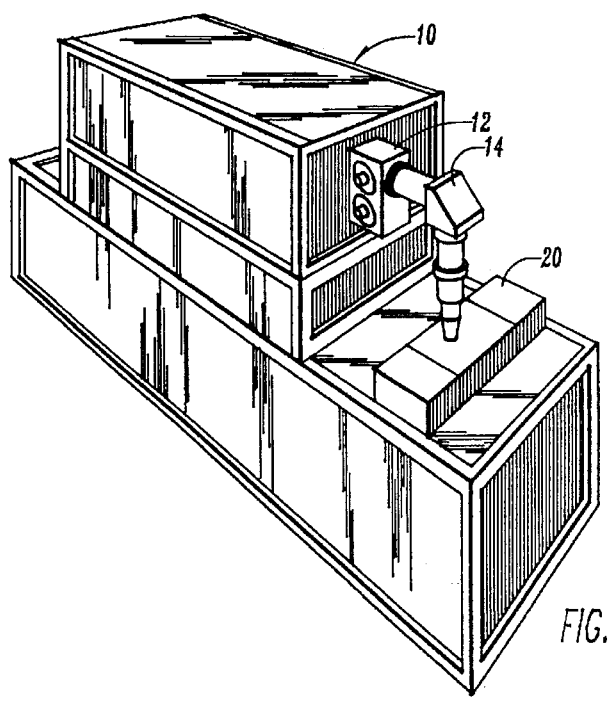
FIG. 1 is a perspective view of the laser system utilized with the present invention.

FIG. 1 illustrates a laser system 10 which may be utilized for the present invention. These systems are currently available for use in making and labeling electrical components. However, these systems have not been utilized for the process contemplated by the present invention. An example of such a system is manufactured by Lambda Physik, Inc., 289 Great Road, Acton, Mass. 01720 under the trademark "Lambda Mark". An example of another preferred system is Model 5000 Laser Marker System, manufactured by Palomar Systems and Machines, Inc., 735 Vinewood Street, Escondido, Calif. 92025.

Figure 2:
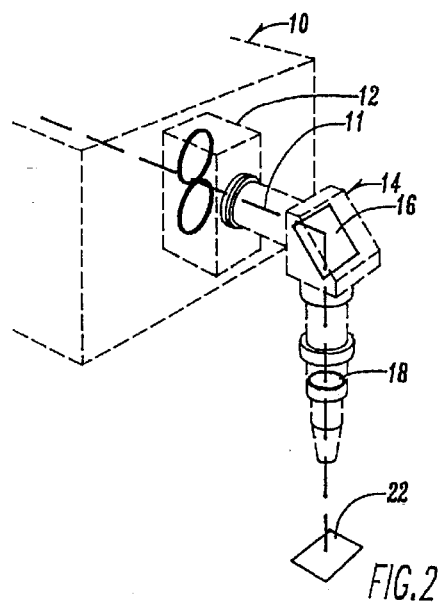
FIG. 2 is a schematic view showing the manner in which the laser system directs the laser beam onto the work piece.
Figure 2A:
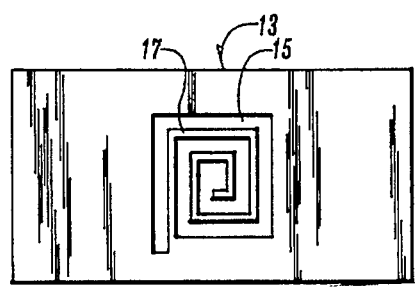
FIG. 2a is a plan view of a mask utilized in the present invention.

The system generates a burst of laser light designated by the line 11 in FIG. 2. The laser light 11 is directed first through a mask assembly 12 which includes a mask or stencil having the desired pattern formed therein. After passing through the mask, the laser is shaped into the image desired and is deflected by mirror assembly 14 having mirror 16 therein downwardly through an imaging lens 18. Lens 18 can reduce the image several times so as to intensify the image and provide greater focus to the image. The image then is directed toward a work surface 20 on which a work piece is placed. With respect to the present invention, a mask 13 is utilized which contains a coil negative pattern 15 therein. Pattern 15 is an opening through the mask 13 which is in the negative shape of the coil desired to be formed. Thus, the resulting coil will ultimately result in the form of the solid portion 17 shown in FIG. 2a.

Figure 3:
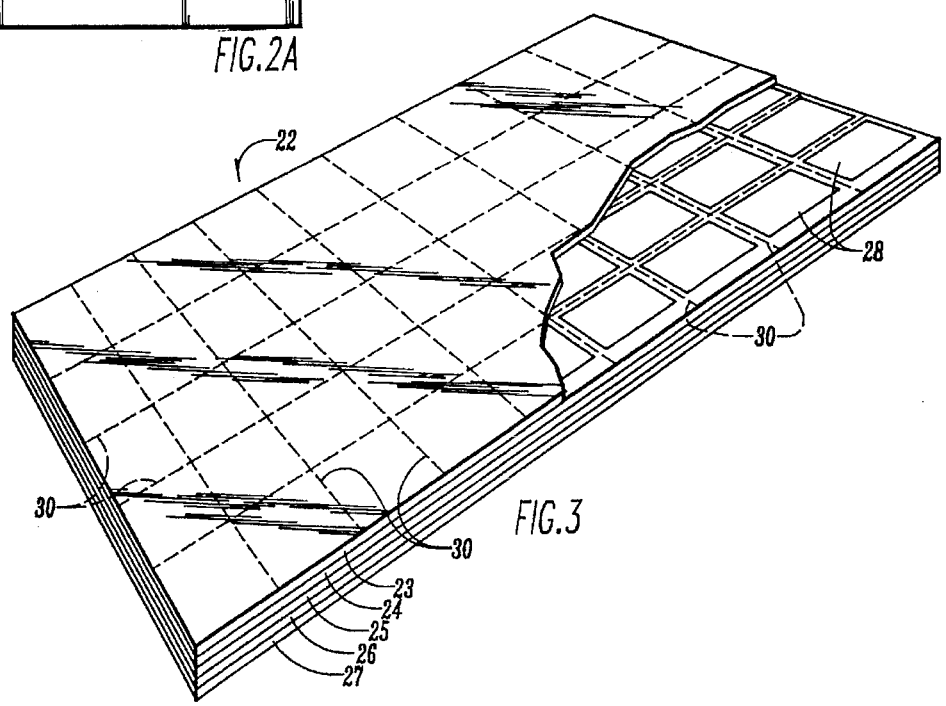
FIG. 3 is a view showing the stacked multiple chip layers which are formed by the present invention.

Referring to FIG. 3, a stack 22 of sheet members 23, 24, 25, 26, 27 is shown. The top sheet member 23 is made of a ferrite material commonly used in the making of monolithic inductor chips. The remaining sheet members 24–27 are also ferrite sheet members, but include various printed conductive coils 28 thereon. The coils 28 on each sheet member are identical to one another, but the coils are different from one sheet member to another as will be explained more fully hereinafter.

The dotted lines 30 represent cut lines which are ultimately cut with a diamond saw to cut each of the stacked members into individual chips containing one set of coils 28. FIG. 3 is drawn out of scale to illustrate the various components of the invention. However, in true scale, the layers 23–27 are paper thin, and the lines of the coils 28 are approximately 5 mills wide with the spaces between the lines within the coils also being approximately 5 mills.

The construction of each individual chip is illustrated in FIGS. 4–8, but in actual practice the layers for a plurality of chips are printed on each of the ferrite layers 23–27 as shown in FIG. 3. A first ferrite layer 34 provides the bottom layer of the chip. This ferrite layer 34 represents one of the chips located in the multi-chip layer 27 shown in FIG. 3.

Figure 4A:
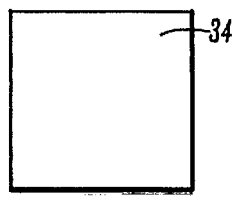
FIGS. 4a–4c are top plan view of a single chip showing the first step in forming a first layer of ferrite material and an electrical conductor coil.
Figure 4B:
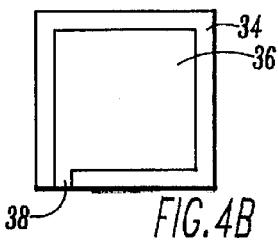

FIG. 4b shows a first solid conductor layer 36 printed on the upper surface of ferrite layer 34. Conductor 36 is preferably a silver material commonly used in printed components of this type. Layer 36 includes a connector pad 38 which extends to the outer margin of ferrite layer 34.

Figure 4C:
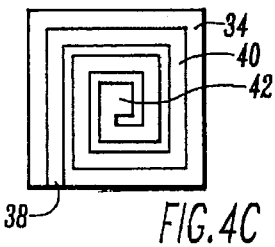

In FIG. 4c, the completed conductive coil 40 is shown. Conductive coil 40 is formed by exposing the conductive layer 36 to a burst of laser light which has first passed through mask 13 and then has been reflected downwardly by mirror 16 through lens 18. Thus, the negative image pattern 15 is focused on the conductive layer 36 and burns away portions of the layer 36 so as to leave the conductive coil 40 as shown in FIG. 4c. Coil 40 includes a center pad 42.

It should be noted that conductive coil 40 includes at least two complete turns of the coil on one surface. Furthermore, the width of the conductor 40 can be as small as 5 mills with the spaces between the conductor coils being approximately 5 mills. This is substantially smaller than is normally achieved with prior devices, and it permits a maximum amount of inductance to be achieved within a minimum of space.

An example of a preferred method for producing the conductive coil 40 shown in FIG. 4c is as follows:

An Excimer laser system 10 such as the system manufactured by Lambda Physik, Inc., 289 Great Rd., Acton, Mass. 01720, under the Trademark "Lambda Mark", may be used to produce conductive coil 40. Another laser system which may be used is Model 5000 Laser Marker System manufactured by Palomar Systems and Machines, Inc., 735 Vinewood Street, Escondido, Calif. 92025. This latter machine is preferred and includes several set up parameters which can be set to produce the desired result. The factors in these parameters are as follows:

1. Various surface materials for the conductive layer 36 produce different results.
2. The character size of the chip is a variable.
3. The character size of the stencil in the mask is a variable.
4. The reduction ratio in the mask holder assembly is a setting on the machine, which is variable.
5. The focusing lens used by the machine, and its micrometer location are variables.
6. The laser power setting, which is the DC voltage setting on the system is another variable.

An example of a preferred setting of the system is as follows:

1. Surface material: unfired silver palladium ink, manufactured by DuPont under the product designation 7711.
2. The character or pattern size: 0.050 inches square to 0.064 inches square.
3. The pattern size in mask: 0.500 inches square.
4. The reduction ratio: between 10:1 and 7.8:1.
5. Focusing lens and micrometer location: SPLF 20/10 lens set at a 56 centimeter position.
6. A laser power setting: 8.8 to 7.5 DC volts.

The system is then actuated to create a pulse of laser light which is exposed to the layer 36 and which burns away a coil 40, as shown in FIG. 4c. The length of time of exposer is estimated to be between 0.5 milliseconds and 2 milliseconds. However, the exact amount of time cannot be determined with accuracy, since the system utilized produces a capacitor discharge for producing the light, and the specific length of time of light exposure is not determinable with accuracy.

Other systems may be utilized to produce the same result, and other settings may also be utilized to produce different types of electrical components.

Figure 5A:
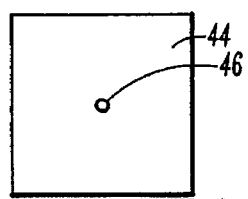
FIGS. 5a–5c; 6a–6c; and 7a–7c are views similar to FIGS. 4a–4c, and show the steps for forming additional layer pairs for the laminated chip.
Figure 5B:
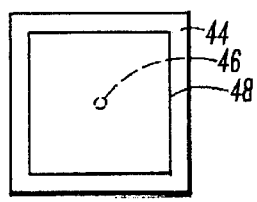
Figure 5C:
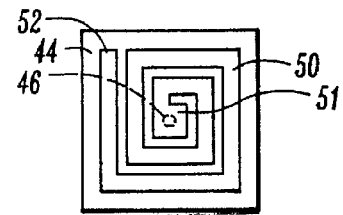

FIGS. 5a, b, and c illustrate the second laminated layer which is formed by utilizing ferrite sheet 44. The individual chip includes a second ferrite layer 44 having an aperture 46 in the center thereof which is in alignment above the center pad 42 of the first conductive coil 40. A second conductive layer 48 is printed over the ferrite layer 44, and the desired image is passed through a mask similar to that shown in FIG. 2a. However, the particular format for the mask is shaped so as to produce the second conductive coil pattern 50 shown in FIG. 5c. Coil pattern 50 includes a second center pad 51 which is in vertical alignment with aperture 46 and includes a second end pad 52. The conductive material at the center pad 51 protrudes downwardly through the aperture 46 so as to make electrical contact with center pad 42 of coil 40. This electrically connects coils 40 and 50 in series with one another.

Figure 6A:
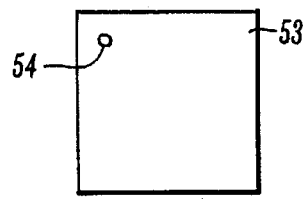
Figure 6B:
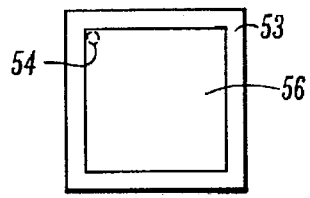
Figure 6C:
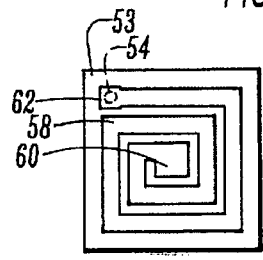

FIGS. 6a–6c show a third laminated layer comprising a third ferrite layer 53 having a connector hole 54 therein; a third conductive layer 56, and a third conductive coil 58 which is formed by a focused laser image similar to the manner in which coils 40 and 50 are formed. The aperture 54 permits the third end pad 62 of coil 58 to be connected to the end pad 52 of coil 50 thereby placing coils 40, 50, and 58 in series with one another. Coil 58 includes a center pad 60.

Figure 7A:
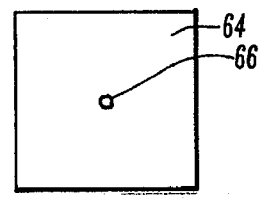
Figure 7B:
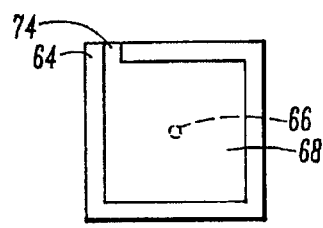
Figure 7C:
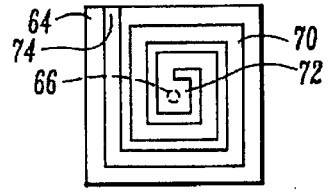
Figure 8:
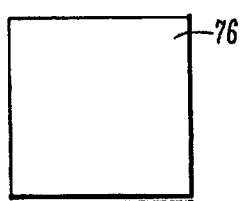
FIG. 8 shows the final layer which is placed on the laminated chip.

FIGS. 7a–7c show a fourth laminated layer having a fourth ferrite layer 64 with an aperture 66 therein; a printed conductive layer 68 having an end pad 74 thereon; and a fourth conductive coil 70 having a center pad 72 thereon. Coil 70 is formed by a focused laser image in similar fashion to the method used for forming coils 40, 50, and 58. The center pad 72 protrudes through aperture 66 so as to form electrical contact with center pad 60 of third conductive coil 58. This places all four of the coils 40, 50, 58, and 70 in series with one another.

Figure 9:
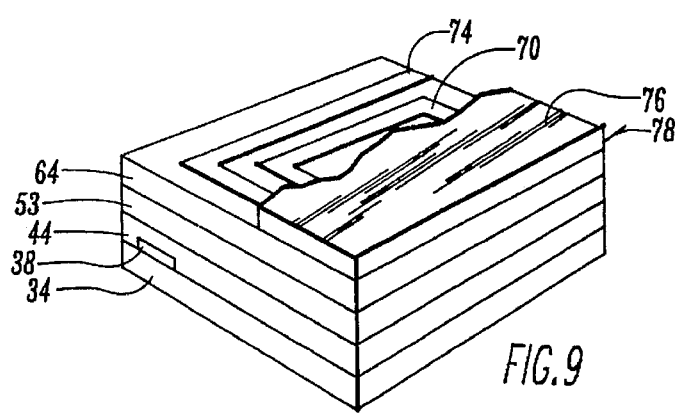
FIG. 9 is a perspective view of a single laminated chip, showing portions of the upper layer cut away.

A final ferrite layer 76 is placed over the laminated pad, so as to provide the configuration shown in FIG. 9.

The chip 78 shown in FIG. 9 comprises one of the plurality of chips which are formed by cutting along the dotted lines 30 of the stack of sheet members 23–37 in FIG. 3. The ferrite layers 34, 44, 53, 64, and 76 are formed from the sheet members 27, 26, 25, 24, and 23 respectively of FIG. 3. The sheet members 23–27 are formed individually and then are placed together in stacked fashion such as shown in FIG. 3. Specifically, the method of the present invention contemplates printing each layer 23–27 individually by printing the conductive layers 36, 48, 56, and 68 thereon. The printed conductors are then permitted to dry. Next, the printed conductors are exposed to the images from the laser system 10. Each sheet member 23–27 is individually exposed, but each sheet member includes a plurality of identical subparts. After the sheet members 23–27 have been exposed to the image to form the coils 40, 50, 58, and 70, the sheet members 23–27 are stacked in the manner shown in FIG. 3 and are pressed together. While being pressed, they are fired so as to cause them to join together into a single unit.

After firing, the laminated sheet members 23–27 are then cut by a diamond saw along the lines 30 so as to form individual stacked chips such as chip 78.

The present invention permits the chips to be miniaturized more than in prior art devices. Because the chips are miniaturized, more than one complete turn of the coil can be placed on each layer; whereas, with prior art devices, it was necessary to place less than a complete turn on each layer. The coils of the present invention can be miniaturized to the point where the conductors have a width of approximately 5 mills with the spacing within the coil also being approximately 5 mills wide. As many stacks as needed can be provided in the chip, or the chip can be comprised of only one coil and one layer.

Because the laser image is reduced down, the laser cut can be many times smaller than that made by screen printing, and the corresponding inductance values can be much larger than presently available. Thus, it can be seen that the device accomplishes at least all of its stated objectives.

I claim:

1. A miniaturized laser cut monolithic chip inductor, comprising:

a plurality of laminated layer pairs stacked upon one another in laminated fashion, each of said layer pairs comprising a first layer of ferrite material and a second layer of conductive material formed on the first layer of ferrite material;

said second layer of conductive material being formed into a coil comprising an elongated coil ribbon extending from an inner coil end and around at least two complete turns to an outer coil end, each of said coils of said laminated pairs being electrically connected in series with one another;

each of said coils of conductive material being formed by printing a plurality of solid layers of said conductive material on a sheet having a plurality of said first layers of said ferrite for a group of inductors and then using a single pulse of laser light focused into a predetermined image directly on said solid layers to burn away all portions of said solid layers except for said coil ribbon;

said turns being adjacent one another and said adjacent turns being spaced 5–8 mils (0.1270–0.2032 mm) apart.

2. A laser cut monolithic chip inductor according to claim 1 wherein each of said coils is formed by passing said pulse of laser light first through a mask having a stencil opening therein shaped in the form of a negative pattern and second through a lens positioned to project an image corresponding to said negative pattern on to said conductive material.

3. A laser cut monolithic chip inductor according to claim 1 wherein said pulse of laser light is between 0.5 and 2.0 milliseconds in length of time.

4. A miniaturized laser cut monolithic chip inductor according to claim 1 wherein said coil ribbon is approximately 5–8 mils (0.1270–0.2032 mm) wide.

5. A miniaturized laser cut monolithic chip inductor according to claim 1 wherein the coil is formed into a spiral.

6. A miniaturized laser cut monolithic chip inductor according to claim 5 wherein each turn of the coil in the spiral comprises four right angle direction changes.

7. A laser cut monolithic chip inductor, comprising:

a plurality of laminated layer pairs stacked upon one another in laminated fashion, each of said layer pairs comprising a first layer of ferrite material and a second layer of conductive material formed on the first layer of ferrite material;

said second layer of conductive material being formed into a coil comprising an elongated coil ribbon extending from an inner coil end and around at least two complete adjacent turns to an outer coil end, each of said coils of said laminated pairs being electrically connected in series with one another;

each of said coils of conductive material being formed by printing a plurality of solid layers of said conductive material on a sheet having a plurality of said first layers of said ferrite for a group of inductors and then using a single pulse of laser light focused into a predetermined image directly on said solid layers to burn away all portions of said solid layers except for said coil ribbon;

said coil ribbon of said coil being approximately 2–8 mils (0.0508–0.2032 mm) wide.

8. A miniaturized laser cut monolithic chip inductor according to claim 7 wherein said coil ribbon of said coil is approximately 5–8 mils (0.1270–0.2032 mm) wide.

9. A miniaturized laser cut monolithic chip inductor, comprising:

a plurality of laminated layer pairs stacked upon one another in laminated fashion, each of said layer pairs comprising a first layer of substrate material and a second layer of conductive material formed on the first layer of substrate material;

said second layer of conductive material being formed into a coil comprising an elongated coil ribbon extending from an inner coil end and around at least two complete turns to an outer coil end, each of said coils of said laminated pairs being electrically connected in series with one another; and each of said coils of conductive material being formed by printing a plurality of solid layers of said conductive material on a sheet having a plurality of said first layers of said substrate material for a group of inductors and then using a single beam of laser light focused into a predetermined image directly on said solid layers to burn away all portions of said solid layers except for said coil ribbon.

10. A laser cut monolithic chip inductor according to claim 9 wherein each of said coils is formed by passing said beam of laser light first through a mask having a stencil opening therein shaped in the form of a negative pattern and second through a lens positioned to project an image corresponding to said negative pattern on to said conductive material.

11. A miniaturized laser cut monolithic chip inductor according to claim 9 wherein the coil is formed into a spiral.

12. A miniature laser cut monolithic chip inductor according to claim 11 wherein each turn of the coil in the spiral comprises four right angle direction changes.

13. A laser cut monolithic chip inductor, comprising:

a plurality of laminated layer pairs stacked upon one another in laminated fashion, each of said layer pairs comprising a first layer of laminated material and a second layer of conductive material formed on the first layer of laminated material;

said second layer of conductive material being formed into a coil comprising an elongated coil ribbon extending from an inner coil end and around at least two complete adjacent turns to an outer coil end, each of said coils of said laminated pairs being electrically connected in series with one another; and each of said coils of conductive material being formed by printing a plurality of solid layers of said conductive material on a sheet having a plurality of said first layers of said laminated material for a group of inductors and then using a single beam of laser light focused into a predetermined image directly on said solid layers to burn away all portions of said solid layers except for said coil ribbon.

* * * * *

UNITED STATES PATENT AND TRADEMARK OFFICE
CERTIFICATE OF CORRECTION

PATENT NO.    : 5,639,391
DATED         : June 17, 1997
INVENTOR(S)   : Herman R. Person It is certified that error appears in the above-identified patent and that said Letters Patent is hereby corrected as shown below:

<u>Title page,</u>
Item [75], Inventor, after "Columbus" please delete "Ohio" and substitute -- Nebr. --

Signed and Sealed this

Nineteenth Day of August, 2003

JAMES E. ROGAN
*Director of the United States Patent and Trademark Office*